United States Patent [19]

Chahbazian

[11] Patent Number: 5,122,773
[45] Date of Patent: Jun. 16, 1992

[54] DEVICE FOR INJECTING AN ELECTROMAGNETIC SIGNAL INTO A CONDUCTIVE WIRE

[75] Inventor: Jacques Chahbazian, Bruyères-le-Chatel, France

[73] Assignee: Prana Recherche et Developpement, Bruyeres le Chatel, France

[21] Appl. No.: 415,287

[22] PCT Filed: Jan. 10, 1989

[86] PCT No.: PCT/FR89/00003
§ 371 Date: Sep. 13, 1989
§ 102(e) Date: Sep. 13, 1989

[87] PCT Pub. No.: WO89/06805
PCT Pub. Date: Jul. 27, 1989

[30] Foreign Application Priority Data

Jan. 13, 1988 [FR] France ............................ 88 00328

[51] Int. Cl.⁵ ...................... H01F 17/06; H01F 27/30
[52] U.S. Cl. ...................................... 336/82; 324/127;
336/174; 336/176; 336/223
[58] Field of Search .................. 324/127; 336/82, 223,
336/174, 175, 176, 212, 83

[56] References Cited

U.S. PATENT DOCUMENTS

| | | | |
|---|---|---|---|
| 1,986,884 | 1/1935 | Fassler | 336/82 |
| 2,655,623 | 10/1953 | Parker | 336/82 |
| 2,895,103 | 7/1959 | Vogt et al. | 336/176 |
| 2,901,713 | 8/1959 | Hartmann | 336/82 |
| 2,901,714 | 8/1959 | Baker | 336/82 |
| 3,314,009 | 4/1967 | Murdock | 324/127 X |
| 3,316,344 | 4/1967 | Kidd et al. | 336/176 |
| 3,414,855 | 12/1968 | Rogers | 336/82 |
| 3,665,356 | 5/1972 | Douglas et al. | 336/175 |
| 3,701,003 | 10/1972 | Anderson | 336/175 |
| 4,263,549 | 4/1981 | Toppeto | 336/223 |
| 4,325,022 | 4/1982 | Pelletier | 324/127 |
| 4,507,709 | 3/1985 | Morris et al. | 336/174 |
| 4,719,414 | 1/1988 | Miller et al. | 324/127 |

OTHER PUBLICATIONS

Navy Technical Disclosure Bulletin, vol. 11, No. 3, Mar. 1986, Farber et al "Clamp-on Signal Injector for Underwater Cable".
Patent Abstracts of Japan, vol. 6, No. 211, Oct. 1982 57-117217 Jul. 21, 1982.

Primary Examiner—Thomas J. Kozma
Attorney, Agent, or Firm—Dennison, Meserole, Pollack & Scheiner

[57] ABSTRACT

A device for injecting an electromagnetic signal into a conductive cable to be tested, the device being generally cylindrical and having a central bore through which the cable passes. A plurality of concentric cylinders is arranged around the central bore, including an inner conductive cylinder, an intermediate ferromagnetic cylinder and an outer conductive cylinder. The inner and outer cylinders are connected at one end to a signal generator by coaxial cable, and are interconnected at the opposite end.

8 Claims, 2 Drawing Sheets

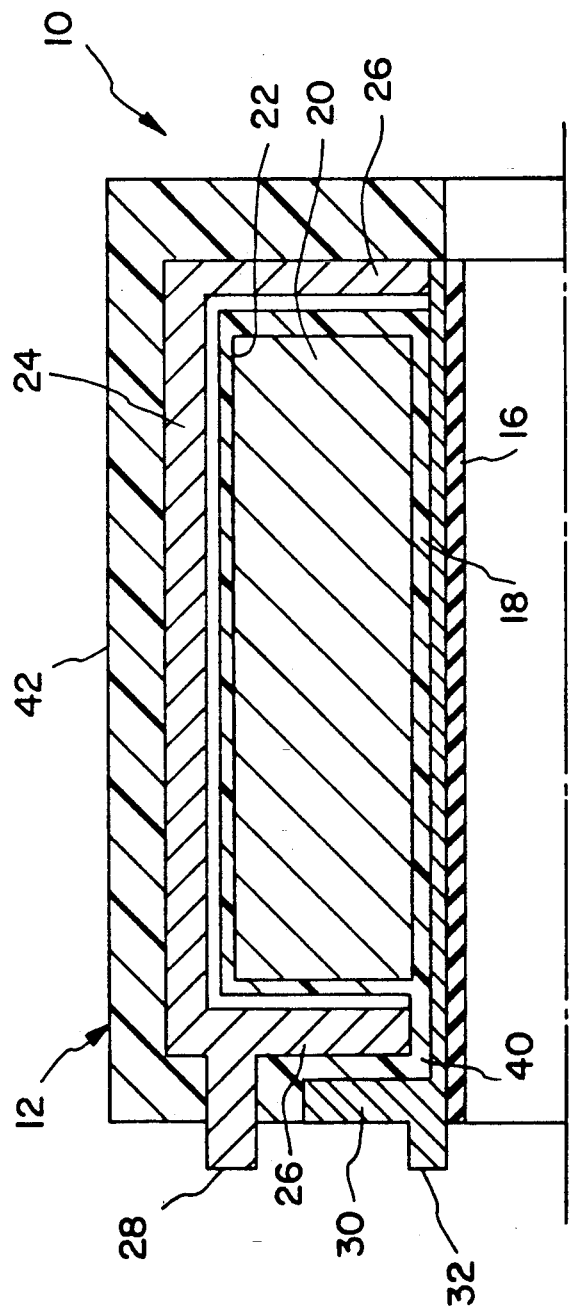

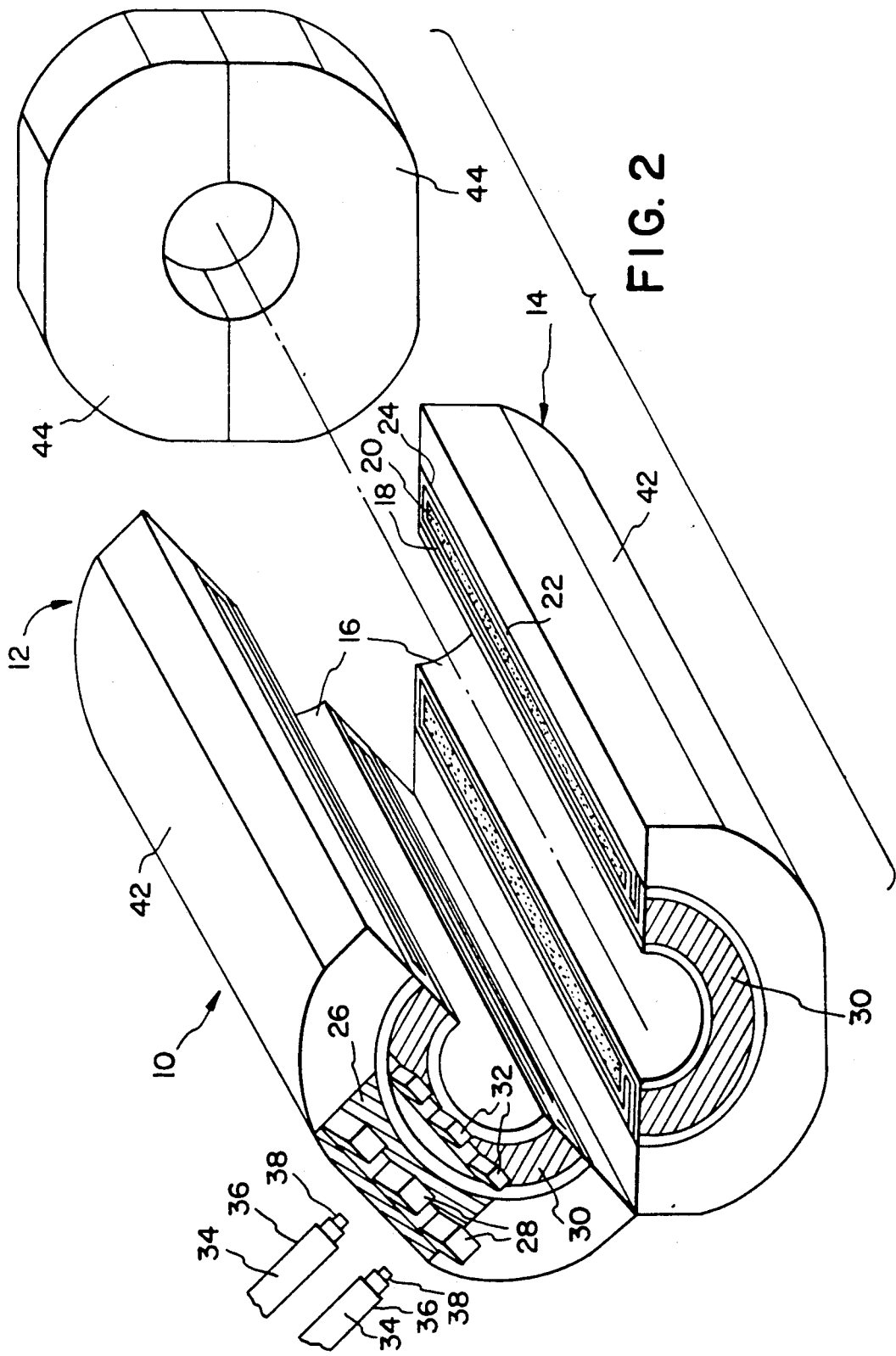

DEVICE FOR INJECTING AN ELECTROMAGNETIC SIGNAL INTO A CONDUCTIVE WIRE

BACKGOUND OF THE INVENTION

The invention concerns a device for injecting an electromagnetic signal into a conductive wire, especially to test its insulation and protection characteristics with regard to electromagnetic disturbances.

The method is already known for injecting into an electroconductive linkage cable between electric or electronic installations or equipment signals simulating lightning or electromagnetic disturbances resulting from a nuclear explosion. For injecting these signals, an openable annular two-piece clamp is used which includes a conductive wire wound onto a ferrite core an connected to a suitable signal generator and which is placed around the cable to be tested.

The results are scarcely satisfactory, as this known device exhibits too high a load impendance, poor efficiency of about 10% (the signal induced in the cable to be tested is weak with respect to the signal supplied by the generator), and the range of useable frequencies is limited.

SUMMARY OF THE INVENTION

The object of the invention is to provided a device for injecting a signal on a conducting wire making it possible to overcome these drawbacks.

The device according to the invention, said device including a two-piece annular clamp intended to be placed around the conductive cable and means for linkage to a signal generator, is characterized in that the clamp includes a thin internal tubular cylindrical conductor encompassed by an intermediate cylinder made of a material with ferromagnetic properties, and a thick external tubular cylindrical conductor, said external and internal conductors being at one extremity connected to the signal generator linkage means and being interconnected at their second extremity.

The device according to the invention exhibits low load impedance and high efficiency, namely of more than 50% and able to reach 80 to 85%. Furthermore, the choice of the section and length of the intermediate cylinder made of, for example, ferrite with ferromagnetic properties makes it possible to determine the low cut-off frequency of the device according to the application in question.

In practice, the pass-band of a device according to the invention is between several kilohertz and about one hundred megahertz.

According to a further characteristic of the invention, the clamp also includes cylinders made of a dielectric material placed between the aforesaid three cylinders, as well as inside the internal cylindrical conductor and outside the external cylindrical conductor.

Advantageously, the cylindrical conductors of the clamp include at their first extremity thick annular edges, said conductors being connected via said edges to the signal generator linkage means.

Thus, the impedance of this linkage means is reduced so that the voltage of the signal supplied by the generator is mainly applied at the extremities of the internal tubular cylindrical conductor of the clamp and not at the extremities of the internal cylindrical conductor/external cylindrical conductor assembly.

According to a further characteristic of the invention, the means linking the signal generator include at least one and preferably two cables with two coaxial conductors, the internal and external conductors of said cables being respectively connected to the internal and external cylindrical conductors of the clamp.

Thus, by feeding the clamp by the coaxial cables in parallel, the impedance of the source feeding the injection clamp is reduced.

According to a futher characteristic of the invention, the device comprses thin detachable conducting cylinders making it possible to adapt the clamp to the diameter of the cable to be tested.

BRIEF DESCRIPTION OF THE DRAWINGS

The invention shall be more readily understood from a reading of the following description given by way of example accompanied by the annexed figures in which:

FIG. 1 is a diagrammatic axial cutaway half-view of the device according to the invention;

FIG. 2 FIG. 2 is a perspective diagrammatic view representing this device partly open.

DESCRIPTION OF THE PREFERRED EMBODIMENTS

The device diagrammatically represented in FIGS. 1 and 2 essentially appears in the form of an annnular cylindrical clamp 10 consisting of two approximately identical parts 12 and 14 interconnected by hinge-type joints (not represented). These two simi-cylindrical parts 12, 14 are also connected to locking means in a closed position around an electroconductive cable to be tested.

Each part 12, 14 of the clamp includes from inside to outside a low inductive power half-cylinder 16 made of a dielectric material, a thin tubular semicylindrical conductor 18 made, for example, of copper, an intermediate half-cylinder 20 made of a mateiral, such as ferrite or any other material with high magnetic permeability, with ferromagnetic properties, a cylinder 22 made of a dielectric material of the same type as that of the cylinder 16, and a relatively thick external tubular semicylindrical conductor 24.

This external conductor 24 includes at its extremities annular edges 26 orientated radially towards the interior. One of these edges 26 includes linking pins or terminals 28, whereas the other annular edge 6 is connected to the corresponding extremity of the internal cylindrical conductor 18.

At its other extremity corresponding to the annular edge 26 bearing the terminals 28, the internal conductor 18 includes or is connected to an annular edge 30 oriented externally and bearing linking pins or terminals 32 corresponding to the terminals 28 of the edge 26 of the external conductor 24.

These terminals 28 and 30 are, for example, silvered and are used for the connection, as show on FIG. 2, of coaxial cables 34 whose external conductors 36 are to be connected by the terminals 28 to the external conductor 24 of the clamp 10 and whose internal conductors 38 are to be connected by the terminals 32 to the internal conductor 18 of the clamp 10.

The annular edges 26 and 30 of the conductors 24 and 18 are insulated from each other by a thickness 40 of a dielectric material, which may also form the insulation between the ferrite cylinder 20 and the internal conductor 18.

A plastic external cylinder 42 covers and protects the external conductor 24 and the extermities of the clamp.

As shown on FIG. 2, according to one embodiment variant, the extremities of the clamp may be protected by plastic half-disks 44 which are screwed or secured by any suitabe device to the extremities of the cylinder 42.

The internal and external conductors 18 and 24 respectively are made of copper, aluminium or any other suitable electroconductive material. The contact between the annular edge 26 of the external conductor 24 and the extremity of the internal conductor 16 is embodied by welding when the internal conductor 18 is not movable, or even by a support with the insertion of a compressible conductor, for example a fine braid made of copper, bronze aluminium or silvered copper.

This device is used as follows:

The coaxial cables 34, connected as indicated to the terminals 28 and 32 of the conductors 24 and 18 of the clamp, are connected to a suitable signal generator and the clamp is placed around a conductive cable to be tested, its two parts 12, 14 each being applied onto the other and locked in this position by any suitable device.

It is essential that there is good contact between the edges of the two ferrite half-cylinders 20 to ensure that the magnetic circuit is closed. In order to improve this contact, the edges of the conductive cylinders 18 and 24 may be slightly hollowed so as to place there a flexible compressible conductor, such a a braiding of conducting wires. On closing of the clamp, it is then possible to obtain good linkage of the edges of the ferrite half-cylinders 20 and good linkage between the edges opposite the conductive cylinders 18 and 24.

The device according to the invention exhibits a relatively low load impedance by virtue of the disposition of the coaxial cables 34, in parallel, which makes it possible to divide their common impedance by two and with low impedance of the conductive edges 26 and 30 and of the external conductor 24. Accordingly, the major part of the load impedance is constituted by the internal conductor 18 at those extermities applied is almost all the voltage difference between the external and internal conductors 36 and 38 respectively of the coaxial cables 34.

This disposition enables the efficiency of the device according to the invention to exceed 50% and may reach 80 to 85%.

In order to establish these notions, there appears below, given by way of examples by no means restrictive, a list of the main characteristics of the device according to the invention:

pass-band: several kilohertz to about one hundred megahertz.
injection current: from 10 to 100–200 amperes.
impedance: from 5–6 to 25–50 ohms.
voltage: up to 1,500–3,000 off-load volts (the cable to be tested not being in place).
efficiency: 50–85%.
thickness of external conductor 24:3 mm.
thickness of internal conductor 18:0.3 mm.
thickness of ferrite cylinder 20:10 to 20 mm.
length of ferrite cylinder 20:150 mm, for example.

What is claimed is:

1. A device for injecting an electromagnetic signal into a conductor in the form of an elongated wire, said device being generally cylindrical. having first and second longitudinal ends and a central longitudinal bore through which the wire passes, and comprising a plurality of concentric cylinders surrounding said bore, including:
   an inner cylinder formed of an electrically conductive material, comprising at said first end means for injecting an electromagnetic signal into said inner cylinder;
   surrounding said inner cylinder, an intermediate cylinder formed of a ferromagnetic material; and
   surrounding said ferromagnetic cylinder, an outer cylinder formed of an electrically conductive material of greater thickness than said inner cylinder, and comprising at said first end means for injecting an electromagnetic signal into said outer cylinder;
   said inner and outer cylinders being electrically connected only at said second end;
   said device being split longitudinally between said first and second ends to divide each of said inner, outer and intermediate cylinders into a pair of semi-cylinders which are separable to enable clamping of the wire in said bore therebetween.

2. Device according to claim 1, additionally comprising:
   a) a dielectric cylinder between said inner cylinder and said central bore.
   b) a dielectric cylinder between said inner cylinder and said intermediate cylinder;
   c) a dielectric cylinder between said intermediate cylinder and said outer cylinder; and
   d) an external protective covering over said outer cylinder.

3. Device according to claim 1 or 2, wherein the inner and outer cylinders include at said first end thick annular edges, connected to the signal injection means.

4. Device according to claim 1 or 2, wherein the signal injection means comprises at least one cable with internal and external coaxial conductors respectively connected to the inner and outer cylinders of the device.

5. Device according to claim 1 or 2, wherein the two semi-cylinders are interconnected by hinge-type joints and comprise flexible compressible conductors placed between edges opposite the semi-cylinder of the inner and outer cylinders so as to ensure good contact on clamping between the edges opposite said semi-cylinders, of said inner and outer cylinders and between the edges opposite the two semi-cylinders made of said ferromagnetic material.

6. Device according to claim 1 or 2, wherein the inner and outer cylinders are made of copper or aluminum.

7. Device according to claim 1 or 2, wherein the intermediate cylinder is a ferrite cylinder.

8. Device according to claim 1 or 2, wherein said inner and outer cylinders are detachable so that the bore size may be adapted to the wire.

* * * * *